United States Patent
Itou

(10) Patent No.: US 6,689,419 B2
(45) Date of Patent: Feb. 10, 2004

(54) METHOD FOR MANUFACTURING SEMICONDUCTOR DEVICE

(75) Inventor: Yoshizumi Itou, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/987,744

(22) Filed: Nov. 15, 2001

(65) Prior Publication Data

US 2002/0072251 A1 Jun. 13, 2002

(30) Foreign Application Priority Data

Dec. 8, 2000 (JP) .................................... 2000-374253

(51) Int. Cl.$^7$ ............................................. B05D 3/12
(52) U.S. Cl. ................... 427/240; 427/346; 427/425; 118/52; 118/320; 438/758; 438/782
(58) Field of Search ................. 427/240, 425, 427/346; 118/52, 320; 438/758, 782

(56) References Cited

U.S. PATENT DOCUMENTS 4,590,094 A * 5/1986 Ringer, Jr. ................ 438/780
5,312,487 A * 5/1994 Akimoto et al. ............ 118/52
5,885,054 A * 3/1999 Kato et al. ................. 414/783
5,945,161 A * 8/1999 Hashimoto et al. ......... 427/240

FOREIGN PATENT DOCUMENTS

JP 5-190438 7/1993
JP 2001-198513 A * 7/2001

\* cited by examiner

Primary Examiner—Shrive P. Beck
Assistant Examiner—Kirsten Crockford Jolley
(74) Attorney, Agent, or Firm—Volentine Francos, PLLC

(57) ABSTRACT

A wafer is held on the upper side of a chuck. The chuck is connected to a spin motor, a motor-pedestal seat and an air cylinder shaft. The spin motor functions to rotate the chuck while the air cylinder shaft functions to elevate the chuck. When a resist is dropped on the wafer, the air is supplied to the air cylinder concurrently with the rotation of the spin motor, thus causing the chuck to move upward while rotating. The upward movement causes a downward inertial force to act on the resist, which in turn causes the resist to be pressed against the wafer while being dispersed over the surface of the wafer.

7 Claims, 3 Drawing Sheets

POOR APPLICATION  BUBBLE ENTRY

METHOD FOR MANUFACTURING SEMICONDUCTOR DEVICE

BACKGROUND OF THE INVENTION

1. Field of the Invention

The present invention relates to the manufacture of semiconductor devices, and more particularly, the present invention relates to the application of a resist material onto a wafer during the manufacture of semiconductor devices.

2. Related Art

In a photolithography process carried out during the manufacture of a semiconductor integrated circuit, it is necessary to apply a resist to a semiconductor wafer. Conventionally, as shown in FIG. 3, a wafer 1 is centered and held by a chuck 3, a resist 5 is dropped on the wafer 1, and the chuck 3 is rotated about its vertical axis. The rotation of the wafer 1 causes the resist 5 to spread over an entire surface of the wafer 1. The film thickness of the resist 5 is adjusted to a desired level by setting the rotating velocity and rotating time of the chuck 3.

In the apparatus shown in FIG. 3, however, when the resist has a high viscosity or the resist is applied on a substrate with poor wettability, certain defects such as those shown in FIG. 4 can result. In particular, the resist liquid can spatter upward resulting in poor application, or a bubble can become trapped at the interface between the resist and the wafer. In an effort to avoid such defects, it is sometimes necessary to apply excess resist onto the wafer.

SUMMARY OF THE INVENTION

An object of the present invention is to provide a method for manufacturing a semiconductor device, in which the application of resist can be achieved with a relatively small quantity resist material, even in the case where the resist has a high viscosity or the substrate has poor wettability.

In the first aspect of the present invention, there is provided a method for manufacturing a semiconductor device which includes placing a wafer onto a rotatable and liftable stage of a resist coating apparatus, the resist coating apparatus including a spin motor for rotating the stage and a lifting device for elevating the stage; setting an acceleration of the lifting device according to at least one of a viscosity of a resist material and a wettability of the wafer; dispensing the resist material onto an upper surface of the wafer; rotating the stage and the wafer to distribute the resist material over the upper surface of the wafer; and controlling the lifting device to elevate the stage and the wafer at the set acceleration while rotating the stage and the wafer.

In the second aspect of the present invention, there is provided a method for manufacturing a semiconductor device which includes placing a wafer onto a rotatable and liftable stage of a resist coating apparatus, the resist coating apparatus including a spin motor which rotates the stage and aerodynamic blades which are fixed to the stage and cause the stage to elevate when rotated; setting a maximum height to which the stage is elevated according to at least one of the viscosity of a resist material and the wettability of the wafer; dispensing the resist material onto an upper surface of the wafer; and rotating the stage and the wafer to distribute the resist material over the upper surface of the wafer, and to cause the aerodynamic blades to elevate the stage and the wafer while the resist material is being distributed over the upper surface of the wafer.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

First Embodiment

Figure 1:
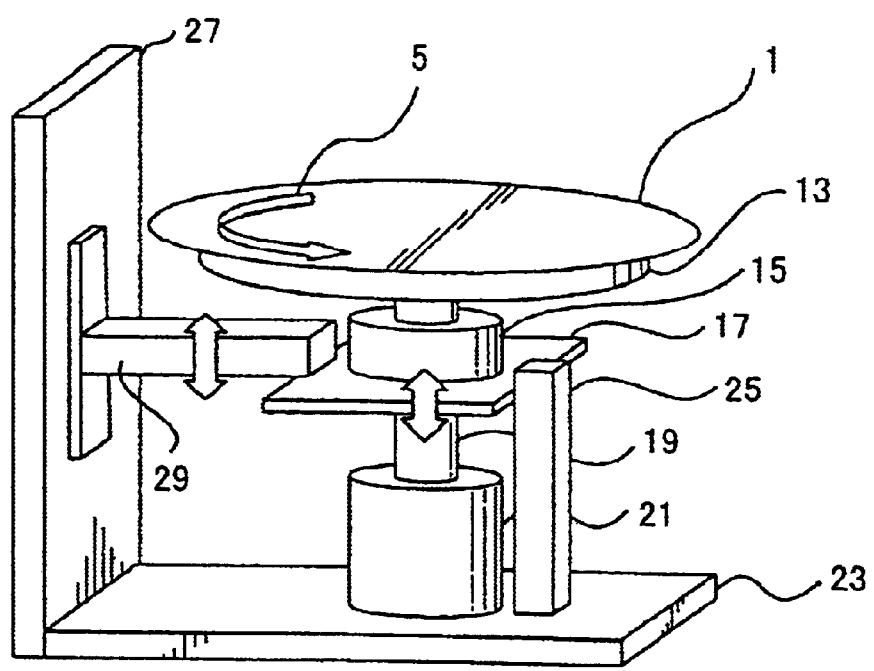
FIG. 1 is a perspective view of a semiconductor manufacturing apparatus according to the first embodiment in the present invention.

Hereafter, the embodiments of the present invention will be described with reference to the drawings. FIG. 1 shows a semiconductor manufacturing apparatus according to the first embodiment in the present invention. A wafer 1 is held on the upper side of a chuck 13. The chuck 13 is connected to a spin motor 15 which causes the chuck 13 to rotate about a vertical axis of the spin motor 15.

The spin motor 15 is coupled to an air cylinder shaft 19 via a motor-pedestal seat 17. The air cylinder shaft 19 can move vertically, sliding in contact with the inside of a cylindrical air cylinder 21. The internal part of the air cylinder 21 is connected to an air-supply apparatus (not shown).

As air is supplied and exhausted by the air-supply apparatus, the air cylinder shaft 19 moves vertically. By changing the air-supply pressure, the upward movement velocity and upward acceleration of the air cylinder shaft 19 can be varied. The air cylinder shaft 19, the wafer 1, the chuck 13, the spin motor 15 and the motor-pedestal seat 17 all move integrally in a vertical direction.

A stick-shaped vertical-movement guide 25 is fixed to a bottom plate 23 and is of sufficient length to extend along the entire moving path of the motor-pedestal seat 17. Although only one guide 25 is shown in FIG. 1, additional vertical-movement guides 25 are provided along each side of the motor-pedestal seat 17. The vertical-movement guides 25 are positioned close to or in light contact with the respective sides of the motor-pedestal seat 17 so as to guide the motor-pedestal seat 17 in a vertical direction.

In addition, a stick-shaped stopper 29 is fixed at one end to a side plate 27 and extends horizontally such that the other end of the stopper 29 is located above the motor-pedestal seat 17. The stopper 29 functions to stop the movement of the motor-pedestal seat 17 when the motor-pedestal seat 17 moves upward to abut the stopper 29. In other words, the stopper 29 defines the uppermost location that the motor-pedestal seat 17 can move. The vertical location at which the stopper 29 is fixed to the side plate 27 is changeable. Therefore, the uppermost location that the motor-pedestal seat 17 can move is also changeable.

In this embodiment, the upward movement path of the wafer 1 is the carrying path of the wafer 1 to the next step. In addition, the wafer having moved upward can be carried in the horizontal direction by an apparatus (not shown).

The operation of this embodiment will now be described. The wafer 1 is centered and held by a chuck 3. Next, a resist 5 is dropped on the wafer 1. In this state, the air cylinder shaft 19 is located at the bottom of its vertical range of movement. Air is supplied to the air cylinder 21 concurrently with the rotation of the spin motor 15, and the air cylinder shaft 19 is accelerated upward along the vertical-movement guides 25.

In this manner, the chuck 13 accelerates upward while rotating. The rotation causes the resist 5 to disperse over the entire surface of the wafer 1. The upward acceleration causes a downward inertial force to act on the resist 5, which in turn causes the resist 5 to be pressed against the wafer 1.

The upward movement stops when the motor-pedestal seat 17 abuts the stopper 29. Also, the spin motor 15 stops rotating to end the resist application. The wafer with the applied resist is then carried in the horizontal direction by an apparatus (not shown) for subsequent processing.

According to the embodiment as described above, since the resist is pressed against the wafer while being dispersed over the surface of the wafer, the application of the resist is improved and the formation of bubbles is avoided even in the case where the resist has a high viscosity or the substrate has poor wettability. Consequently, less resist material is needed than in the case where the resist is applied by rotation only.

In this embodiment, the upward movement velocity and upward acceleration can be variably set by controlling the air-supply pressure. In addition, the vertical movement distance can be variably set by changing the fixed location of the stopper 29.

The movement velocity and acceleration, and the movement distance, can be variably set according to the viscosity of the resist 5 and the wettability of the wafer 1. For example, when the resist 5 has a low viscosity and is easy to spread, the acceleration is lowered and the movement distance is shortened, and when the resist 5 has a high viscosity and is hard to spread, the acceleration is increased and the movement distance is extended. In addition, since the upward movement path becomes the transfer path for the wafer, the resist application step and the transfer step can be implemented concurrently. Therefore, the transfer time can be shortened.

It is to be noted that the air cylinder 21 is used as the vertical movement mechanism in this embodiment. Various other mechanisms can be adopted instead. For example, a stepping motor may be used in which the movement distance is set according to the rotating number of the stepping motor and the movement acceleration is set according to the rotating velocity of the stepping motor.

Second Embodiment

Figure 2:
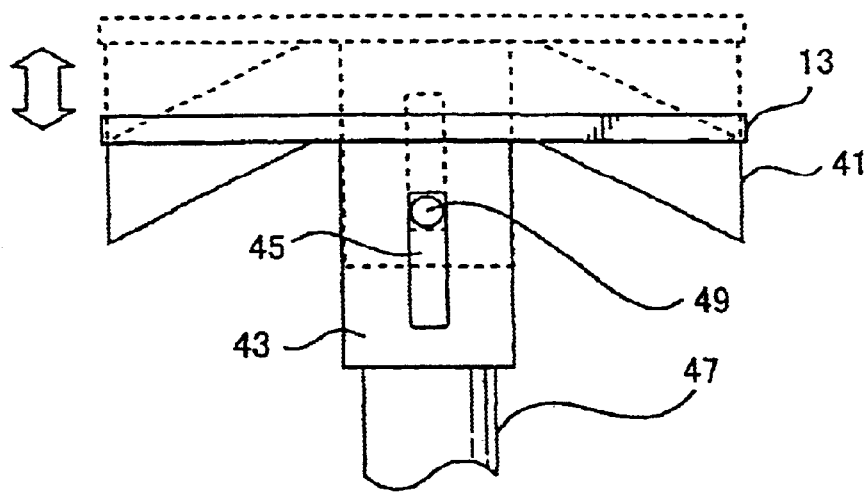
FIG. 2 is a main part side view of a semiconductor manufacturing apparatus according to the second embodiment in the present invention.
Figure 3:
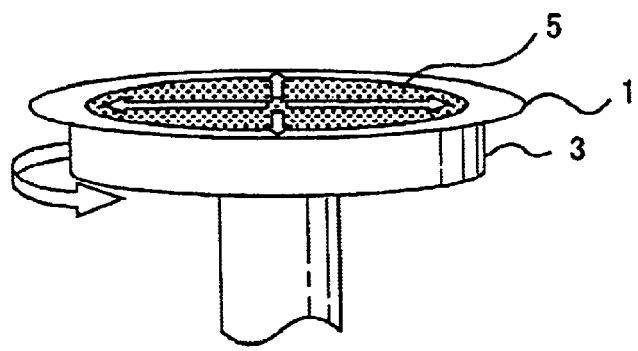
FIG. 3 illustrates the principle of operation of a conventional apparatus.
Figure 4:
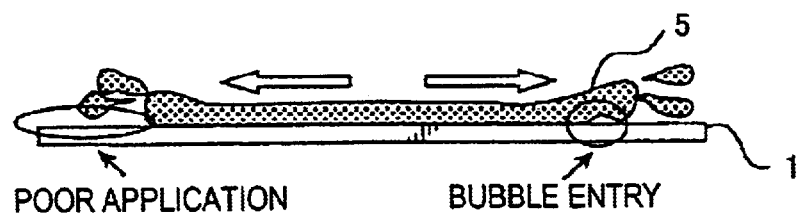
FIG. 4 shows problems encountered with a conventional apparatus.

FIG. 2 is a main part side view of a semiconductor manufacturing apparatus according to the second embodiment in the present invention. In this embodiment, an aerodynamic blade 41 is set under a chuck 13. A column support 43 supporting the chuck 13 has a cylindrical shape, and a rotational axis shaft 47 is inserted therein. The chuck 13 and the column support 43 can move integrally in a vertical direction coincident with the rotational axis shaft 47. The rotational axis shaft 47 is coupled to a rotation device (not shown), and can rotate around its vertical axis. As the rotational axis shaft 47 rotates, the column support 43 and the chuck 13 also rotate.

In the side of the column support 43, an rectangular opening 45 is provided which extends lengthwise in a vertical direction. A stopper 49 provided on the rotational axis shaft 47 protrudes through the opening 45. When the column support 43 moves vertically, the stopper 49 abuts the edge of the opening 45 to stop the movement of the column support 43.

The operation in this embodiment will now be described. The wafer 1 is held by a chuck 3, and a resist 5 is dropped on the wafer 1. In this state, the stopper 49 is located at the uppermost side of the opening 45. The rotational axis shaft 47 is rotated around its vertical axis by the rotation device (not shown), thus causing rotation of the chuck 13.

A lift force is then generated by rotation of the aerodynamic blades 41 which are fixed to the rotating chuck, and the chuck 13 and column support 43 are thereby lifted. Eventually the upward movement is stopped when the lower side of the opening 45 abuts the stopper 49.

According to the second embodiment as described above, the resist is pressed against the wafer while being dispersed over the surface of the wafer. Accordingly, the application of the resist is improved and the formation of bubbles is avoided even in the case where the resist has a high viscosity or the substrate has poor wettability. Consequently, less resist material is needed than in the case where the resist is applied by rotation only.

According to this embodiment, the aerodynamic blades 41 cause the chuck 13 to move upward automatically when rotation occurs. Therefore, an advantage can be achieved in that there is no need to provide the air cylinder 21 or the like of the first embodiment.

In this embodiment, the vertical movement velocity is determined by the shape of the blades 41 and the rotational velocity. The movement distance is determined by the length of the opening 45 and the location of the stopper 49. The location of the stopper 49 is fixed in this embodiment, but the movement distance can be made variable if the location of the stopper 49 on the rotational axis shaft 47 is made adjustable or if a timing device is used.

In this example, when the resist has a low viscosity and is easy to spread, the movement distance is shortened, and when the resist has a high viscosity and is hard to spread, the movement distance is extended.

In the present invention as described above, the resist application can be achieved with a relatively small quantity of resist even in the case where the resist has a high viscosity or the substrate has poor wettability. Further, in another aspect of the present invention, the resist application and the wafer transfer may be implemented simultaneously to shorten the time for transferring the wafer.

What is claimed is:

1. A method for manufacturing a semiconductor device, comprising:

placing a wafer onto a rotatable and liftable stage of a resist coating apparatus such that an upper surface of the wafer faces in an upward direction, the resist coating apparatus including a spin motor for rotating the stage and a lifting device for elevating the stage in the upward direction;

setting an acceleration of the lifting device according to at least one of a viscosity of a resist material and a wettability of the wafer;

dispensing the resist material onto the upper surface of the wafer;

rotating the stage and the wafer to distribute the resist material over the upper surface of the wafer; and controlling the lifting device to elevate the stage and the wafer at the set acceleration while rotating the stage and the wafer to distribute the resist material over the upper surface of the wafer.

2. A method for manufacturing a semiconductor device according to claim 1, further comprising setting a maximum height to which the stage and wafer are elevated according to at least one of the viscosity of a resist material and the wettability of the wafer.

3. A method for manufacturing a semiconductor device according to claim 2, further comprising transferring the wafer in a horizontal direction after the stage and wafer have been elevated to the maximum height.

4. A method as claimed in claim 2, wherein the maximum height is set by adjusting the position of a blocking member which impedes the vertical movement of the stage.

5. A method for manufacturing a semiconductor device, comprising:

placing a wafer onto a rotatable and liftable stage of a resist coating apparatus such that an upper surface of the wafer faces in an upward direction, the resist coating apparatus including a spin motor which rotates the stage and aerodynamic blades which are fixed to the stage and cause the stage to elevate in the upward direction when rotated;

setting a maximum height to which the stage is elevated according to at least one of the viscosity of a resist material and the wettability of the wafer;

dispensing the resist material onto the upper surface of the wafer; and rotating the stage and the wafer to distribute the resist material over the upper surface of the wafer, and to cause the aerodynamic blades to elevate the stage and the wafer while the resist material is distributed over the upper surface of the wafer.

6. A method for manufacturing a semiconductor device according to claim 5, further comprising transferring the wafer in a horizontal direction after the stage and wafer have been elevated to the maximum height.

7. A method as claimed in claim 5, wherein the maximum height is set by adjusting the position of a blocking member which impedes the vertical movement of the stage.

* * * * *